(12) United States Patent
Zheng et al.

(10) Patent No.: US 9,966,957 B2
(45) Date of Patent: May 8, 2018

(54) SHIFT REGISTER AND A DRIVING METHOD THEREOF, A GATE DRIVING CIRCUIT AND A DISPLAY DEVICE

(71) Applicant: BOE TECHNOLOGY GROUP CO., LTD., Beijing (CN)

(72) Inventors: Can Zheng, Beijing (CN); Song Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/519,966

(22) PCT Filed: Oct. 13, 2016

(86) PCT No.: PCT/CN2016/101987
§ 371 (c)(1),
(2) Date: Apr. 18, 2017

(87) PCT Pub. No.: WO2017/118136
PCT Pub. Date: Jul. 13, 2017

(65) Prior Publication Data
US 2018/0091151 A1    Mar. 29, 2018

(30) Foreign Application Priority Data
Jan. 5, 2016    (CN) .......................... 2016 1 0003941

(51) Int. Cl.
*G11C 19/00*    (2006.01)
*H03K 19/096*    (2006.01)
(Continued)

(52) U.S. Cl.
CPC ......... *H03K 19/096* (2013.01); *G09G 3/3266* (2013.01); *G11C 19/28* (2013.01)

(58) Field of Classification Search
CPC ..... H03K 19/096; G09G 3/3266; G11C 19/28
(Continued)

(56) References Cited

U.S. PATENT DOCUMENTS 8,392,775 B2 *   3/2013   Liu .................. G01R 31/31855
                                              714/729
2011/0193853 A1 *  8/2011  Sakamoto ............ G09G 3/3677
                                              345/213
(Continued)

FOREIGN PATENT DOCUMENTS

CN         101221818       7/2008
CN         103559913       2/2014
(Continued)

OTHER PUBLICATIONS

PCT (CN) International Search Report, Application No. PCT/CN2016/101987, dated Jan. 20, 2017, 13 pps.
(Continued)

*Primary Examiner* — Thomas Skibinski
(74) *Attorney, Agent, or Firm* — Armstrong Teasdale LLP

(57) ABSTRACT

Embodiments of the present disclosure provide a shift register and a driving method thereof, a gate driving circuit and a display device. The shift register includes a control signal generation module, a first low level pulse generation module, a second low level pulse generation module, and a high level pulse generation module. The control signal generation module generates a first control signal and a second control signal. The first low level pulse generation module receives the first control signal and the second control signal and generate a first low level pulse signal. The second low level pulse generation module receives the first control signal and the second control signal and generate a second low level pulse signal. The high level pulse generation module receives the first control signal and generates a
(Continued)

high level pulse signal. This shift register reduces the number of circuit elements.

16 Claims, 8 Drawing Sheets

(51) Int. Cl.
*G11C 19/28* (2006.01)
*G09G 3/3266* (2016.01)

(58) Field of Classification Search
USPC ............ 377/73–81, 70, 64, 66, 67; 327/291, 327/293–296, 298, 299
See application file for complete search history.

(56) References Cited

U.S. PATENT DOCUMENTS

| | | | | |
|---|---|---|---|---|
| 2011/0216874 A1* | 9/2011 | Toyotaka | ............. | G11C 19/184 377/75 |
| 2011/0216875 A1* | 9/2011 | Miyake | ................... | G09G 3/20 377/75 |
| 2013/0322592 A1* | 12/2013 | Miyake | ................ | G11C 19/184 377/64 |
| 2014/0168044 A1* | 6/2014 | Hu | ........................ | G09G 3/3696 345/90 |
| 2016/0064098 A1* | 3/2016 | Han | ........................ | G11C 19/28 345/211 |
| 2016/0071614 A1* | 3/2016 | Lee | ........................ | G09G 5/006 345/214 |
| 2017/0004889 A1* | 1/2017 | Li | .......................... | G11C 19/28 |
| 2017/0269769 A1* | 9/2017 | Hu | ........................ | G06F 3/0416 |

FOREIGN PATENT DOCUMENTS

| | | |
|---|---|---|
| CN | 103985341 A | 8/2014 |
| CN | 104809978 A | 7/2015 |
| CN | 105632561 A | 6/2016 |

OTHER PUBLICATIONS

PCT (CN) Written Opinion, Application No. PCT/CN2016/101987, dated Jan. 20, 2017, 10 pps.: with English Translation.

* cited by examiner

SHIFT REGISTER AND A DRIVING METHOD THEREOF, A GATE DRIVING CIRCUIT AND A DISPLAY DEVICE

CROSS REFERENCE TO RELATED APPLICATIONS

This application is a National Stage Entry of PCT/CN2016/101987 filed Oct. 13, 2016, which claims the benefit and priority of Chinese Patent Application No. 201610003941.X, filed on Jan. 5, 2016, the disclosures of which are incorporated by reference herein in their entity as part of the present application.

BACKGROUND

The present disclosure relates to the field of display technology, and particularly, to a shift register and a driving method thereof, a gate driving circuit, and a display device.

In the field of display technology, in order to continuously improve the display picture and the user experience, the display with high-definition, high PPI (Pixels Per Inch) and narrow bezel has become a focus of research. When displaying, a display requires a progressive scan to write data signals to pixel units. FIG. 1 is a schematic diagram of pulse signals for an OLED (Organic Light-Emitting Diode) pixel circuit. As shown in FIG. 1, generally, two low level pulse signals G1, G2 and one high level pulse signal G3 are required to write data to the OLED pixel unit. These signals G1, G2, G3 need to be provided by the shift register circuit. As the number of pixels increases, the number of rows needs to be scanned in one frame by the shift register increases. In the case where the display screen size is constant, the area left to each row shift register is gradually reduced. In addition, the requirement for the narrow bezel makes the requirement for the area of each row of the shift register more strict, therefore it is very necessary to explore a shift register circuit with simple structure and less transistors.

BRIEF DESCRIPTION

Embodiments of the present disclosure provide a shift register and its driving method, a gate driving circuit, and a display device that use fewer circuit elements and can be applied to a narrow bezel display.

According to a first aspect, embodiments of the present disclosure provide a shift register including a control signal generation module, a first low level pulse generation module, a second low level pulse generation module, and a high level pulse generation module. The control signal generation module is connected to a first clock terminal, a second clock terminal, a first voltage terminal, a second voltage terminal and a first input terminal, and is configured to generate a first control signal and a second control signal. The first low level pulse generation module is connected to the second clock terminal and the first voltage terminal, and is configured to receive the first control signal and the second control signal from the control signal generation module and generate a first low level pulse signal. The second low level pulse generation module is connected to a third clock terminal and the first voltage terminal, and is configured to receive the first control signal and the second control signal from the control signal generation module and generate a second low level pulse signal. The high level pulse generation module is connected to the first clock terminal, the first voltage terminal, the second voltage terminal and a second input terminal, and is configured to receive the first control signal from the control signal generation module and generate a high level pulse signal.

In embodiments of the present disclosure, the control signal generation module includes a first transistor, a second transistor, a third transistor, a fourth transistor, a fifth transistor, and a first capacitor. The control electrode of the first transistor is connected to the first clock terminal, the first electrode of the first transistor is connected to the first input terminal, and the second electrode of the first transistor is connected to the second electrode of the second transistor. The control electrode of the second transistor is connected to the second clock terminal, the first electrode of the second transistor is connected to the second electrode of the third transistor, and the second electrode of the second transistor is connected to the second electrode of the first transistor. The control electrode of the third transistor is connected to the first electrode of the fourth transistor, the first electrode of the third transistor is connected to the first voltage terminal, and the second electrode of the third transistor is connected to the first electrode of the second transistor. The control electrode of the fourth transistor is connected to the first clock terminal, the first electrode of the fourth transistor is connected to the control electrode of the third transistor, and the second electrode of the fourth transistor is connected to the second voltage terminal. The control electrode of the fifth transistor is connected to the second electrode of the first transistor, the first electrode of the fifth transistor is connected to the control electrode of the third transistor, and the second electrode of the fifth transistor is connected to the first clock terminal. The first capacitor is connected between the first voltage terminal and the control electrode of the third transistor. The connection point of the second electrode of the first transistor and the second electrode of the second transistor forms a first control signal output terminal configured to output the first control signal. The connection point of the control electrode of the third transistor and the first electrode of the fourth transistor forms a second control signal output terminal configured to output the second control signal.

In embodiments of the present disclosure, the first low level pulse generation module includes a sixth transistor, a seventh transistor, and a second capacitor. The control electrode of the sixth transistor is configured to receive the first control signal, the first electrode of the sixth transistor is connected to the second electrode of the seventh transistor, and the second electrode of the sixth transistor is connected to the second clock terminal. The control electrode of the seventh transistor is configured to receive the second control signal, the first electrode of the seventh transistor is connected to the first voltage terminal, and the second electrode of the seventh transistor is connected to the first electrode of the sixth transistor. The second capacitor is connected between the first electrode of the sixth transistor and the control electrode of the sixth transistor. The connection point of the first electrode of the sixth transistor and the second electrode of the seventh transistor forms a first low level pulse output terminal configured to output the first low level pulse signal.

In embodiments of the present disclosure, the second low level pulse generation module includes an eighth transistor, a ninth transistor, and a third capacitor. The control electrode of the eighth transistor is configured to receive the first control signal, the first electrode of the eighth transistor is connected to the second electrode of the ninth transistor, and the second electrode of the eighth transistor is connected to the third clock terminal. The control electrode of the ninth transistor is configured to receive the second control signal, the first electrode of the ninth transistor is connected to the first voltage terminal, and the second electrode of the ninth transistor is connected to the first electrode of the eighth transistor. The third capacitor is connected between the first electrode of the eighth transistor and the control electrode of the eighth transistor. The connection point of the first electrode of the eighth transistor and the second electrode of the ninth transistor forms a second low level pulse output terminal configured to output the second low level pulse signal.

In embodiments of the present disclosure, the high level pulse generation module includes a tenth transistor, an eleventh transistor, a twelfth transistor, a thirteenth transistor, a fourteenth transistor, a fifteenth transistor, a fourth capacitor, and a fifth capacitor. The control electrode of the tenth transistor is connected to the first clock terminal, the first electrode of the tenth transistor is connected to the first voltage terminal, and the second electrode of the tenth transistor is connected to the first electrode of the eleventh transistor. The control electrode of the eleventh transistor is connected to the second input terminal, the first electrode of the eleventh transistor is connected to the second electrode of the tenth transistor, and the second electrode of the eleventh transistor is connected to the first electrode of the twelfth transistor. The control electrode of the twelfth transistor is configured to receive the first control signal, the first electrode of the twelfth transistor is connected to the second electrode of the eleventh transistor, and the second electrode of the twelfth transistor is connected to the second voltage terminal. The control electrode of the thirteenth transistor is connected to the first clock terminal, the first electrode of the thirteenth transistor is connected to the second input terminal, and the second electrode of the thirteenth transistor is connected to the control electrode of the fifteenth transistor. The control electrode of the fourteenth transistor is connected to the second electrode of the eleventh transistor, the first electrode of the fourteenth transistor is connected to the first clock terminal, and the second electrode of the fourteenth transistor is connected to the first electrode of the fifteenth transistor. The control electrode of the fifteenth transistor is connected to the second electrode of the thirteenth transistor, the first electrode of the fifteenth transistor is connected to the second electrode of the fourteenth transistor, and the second electrode of the fifteenth transistor is connected to the second voltage terminal. The fourth capacitor is connected between the first voltage terminal and the control electrode of the fourteenth transistor. The fifth capacitor is connected between the first electrode of the fifteenth transistor and the control electrode of the fifteenth transistor. The connection point of the second electrode of the fourteenth transistor and the first electrode of the fifteenth transistor forms a high level pulse output terminal configured to output the high level pulse signal.

According to a second aspect, embodiments of the present disclosure provide a method for driving the shift register abovementioned, including in a first phase, providing a low level signal at a first clock terminal, a high level signal at a second clock terminal, a high level signal at a third clock terminal, a low level signal at a first input terminal, and a high level signal at a second input terminal, such that the shift register outputs a first low level pulse signal with high level, a second low level pulse signal with high level, and a high level pulse signal with low level, in a second phase, providing a high level signal at the first clock terminal, a low level signal at the second clock terminal, a high level signal at the third clock terminal, a high level signal at the first input terminal, a high level signal at the second input terminal, such that the shift register outputs a first low level pulse signal with low level, a second low level pulse signal with high level and a high level pulse signal with high level, in a third phase, providing a high level signal at the first clock terminal, a high level signal at the second clock terminal, a low level signal at the third clock terminal, a high level signal at the first input terminal, a low level signal at the second input terminal, such that the shift register outputs a first low level pulse signal with high level, a second low level pulse signal with low level and a high level pulse signal with high level, and in a fourth phase, providing a low level signal at the first clock terminal, a high level signal at the second clock terminal, a high level signal at the third clock terminal, a high level signal at the first input terminal, a low level signal at the second input terminal, such that the shift register outputs a first low level pulse signal with high level, a second low level pulse signal with high level and a high level pulse signal with low level.

According to a third aspect, embodiments of the present disclosure provide a gate driving circuit including a plurality of shift registers abovementioned in cascade, wherein each of the shift registers provides a first low level pulse signal, a second low level pulse signal, and a high level pulse signal. The shift register in a previous stage provides the first low level pulse signal to the first input terminal of the shift register in a next stage, and the shift register in a previous stage provides the high level pulse signal to the second input terminal of the shift register in a next stage.

According to a fourth aspect, embodiments of the present disclosure provide a display device including the above-described gate driving circuit.

With the shift register of the embodiments of the present disclosure, three different pulse signals may be generated in one shift register. Compared to the technique of providing three pulse signals using three circuits respectively, the number of elements and control signals may be greatly reduced, and it may be applied to a display with narrow bezel.

BRIEF DESCRIPTION OF THE DRAWINGS

In order to more clearly illustrate the technical solution of embodiments of the present disclosure, the drawings of the embodiments will be briefly described below, and it should be understood that the drawings described below relate only to some embodiments of the present disclosure and are not intended to be limiting of the present disclosure, in which.

DETAILED DESCRIPTION

In order to make the technical solution and advantages of the embodiments of the present disclosure more clear, the technical solution of the embodiments of the present disclosure will be described clearly and completely below in conjunction with the accompanying drawings. It is obvious that the embodiments described are part of the present disclosure, rather than all of the embodiments. All other embodiments obtained by those skilled in the art based on the described embodiments of the present disclosure without creative work also fall within the scope of protection of this disclosure.

Figure 1:
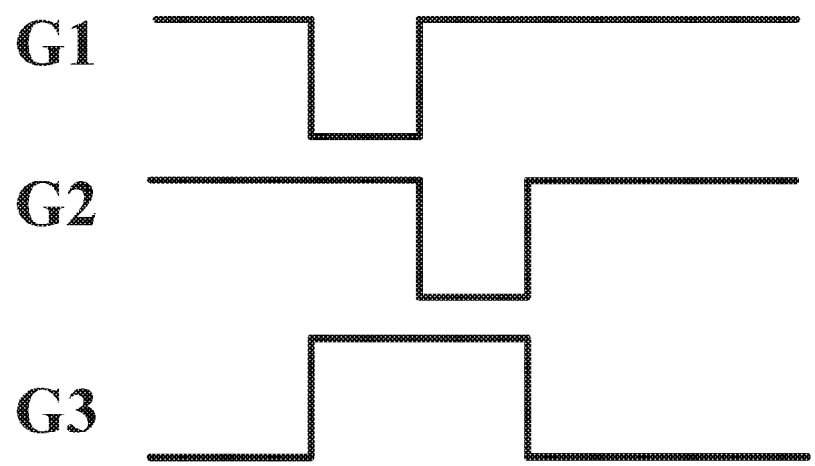
FIG. 1 is a schematic diagram of a pulse signal for an OLED pixel circuit.
Figure 2:
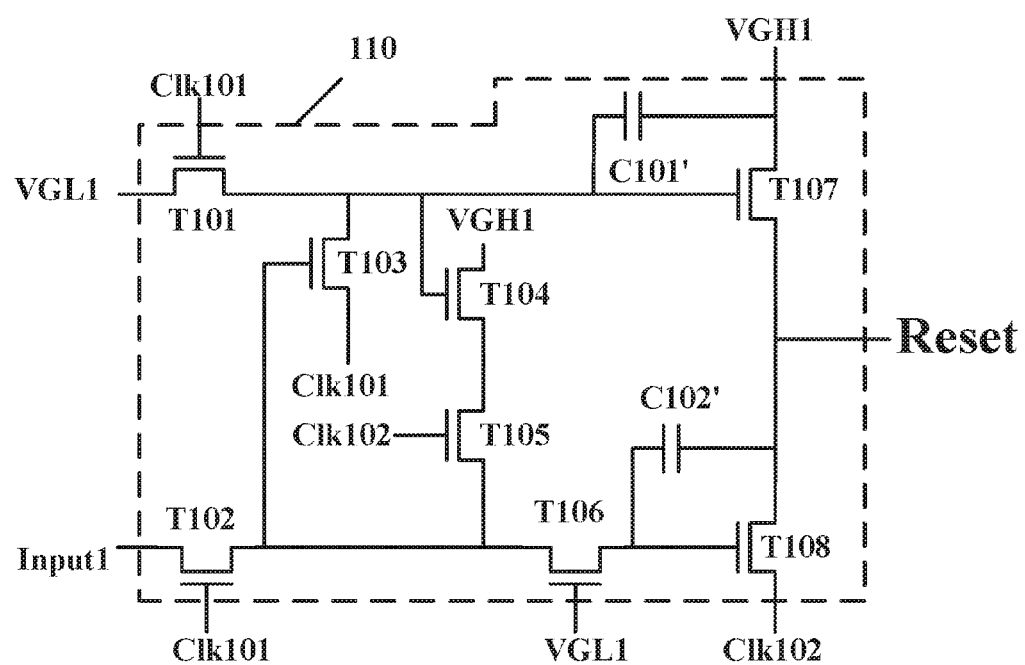
FIG. 2 is a schematic diagram of a circuit for providing a first low level pulse signal in FIG. 1.
Figure 3:
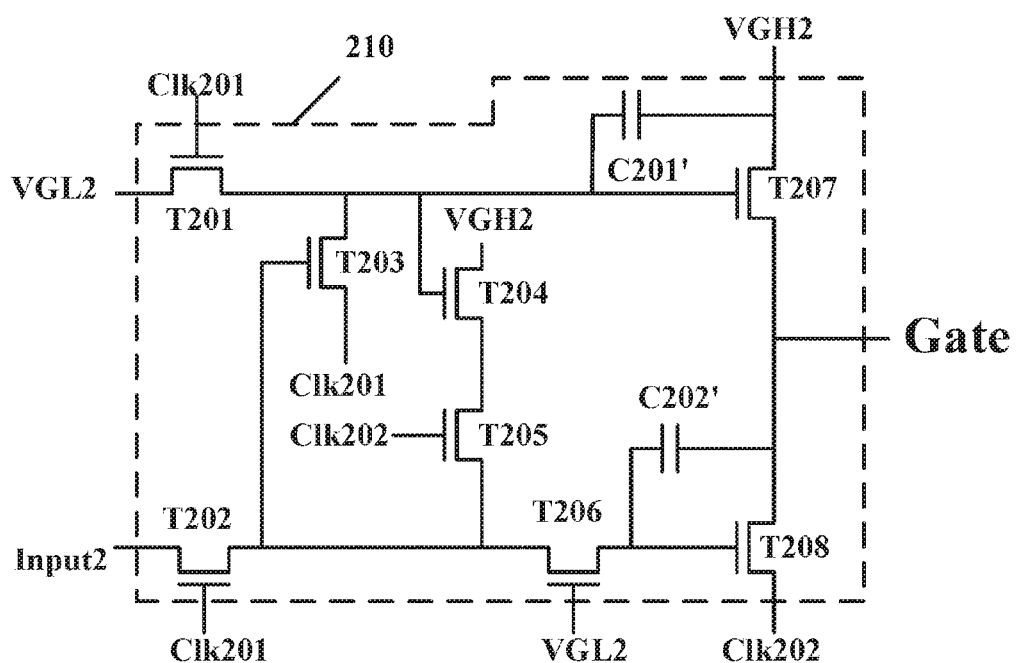
FIG. 3 is a schematic diagram of a circuit for providing a second low level pulse signal in FIG. 1.
Figure 4:
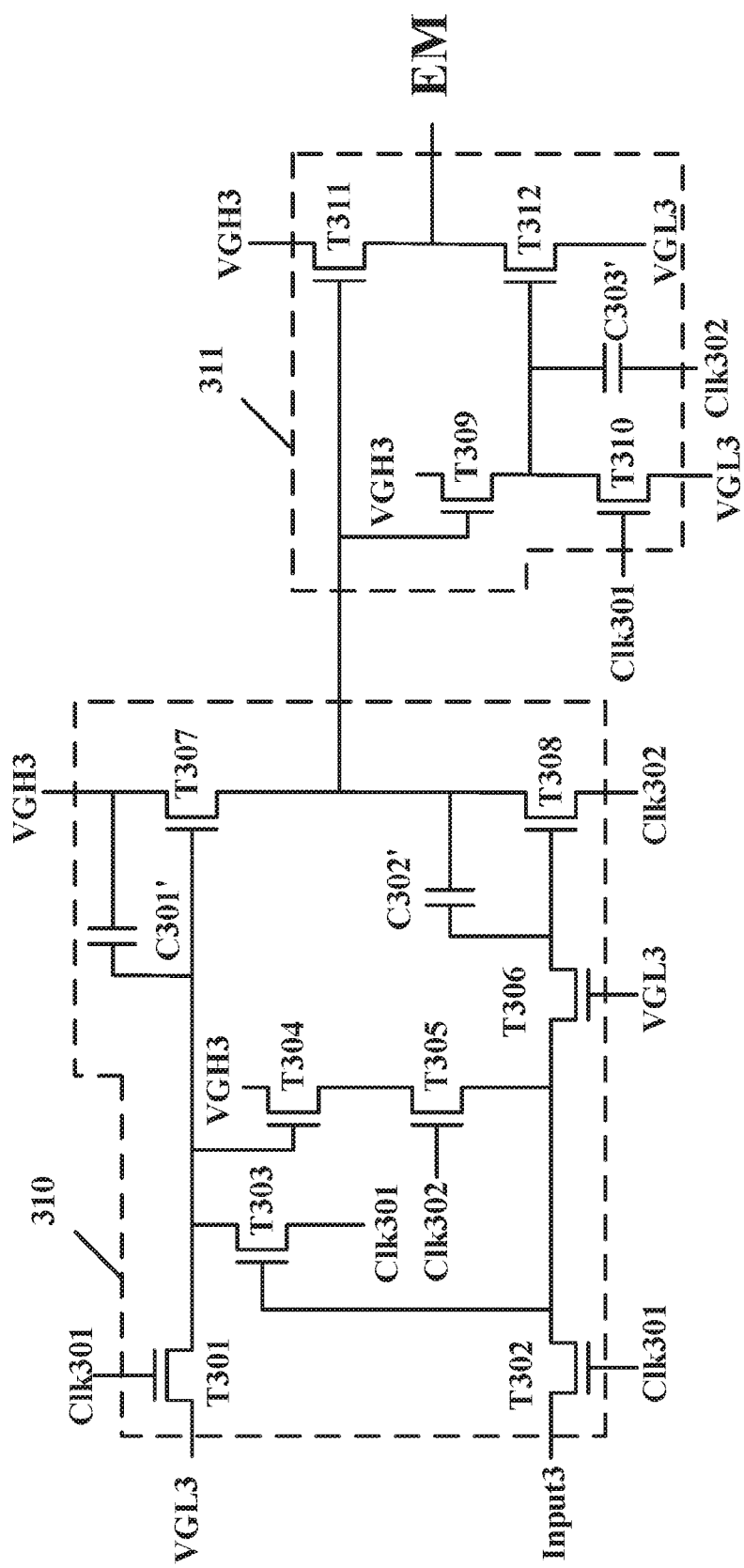
FIG. 4 is a schematic diagram of a circuit for providing a high level pulse signal in FIG. 1.

The signals G1, G2, G3 in FIG. 1 may be generated by three circuits, respectively. FIG. 2 is a circuit diagram for providing the first low level pulse signal in FIG. 3 is a schematic diagram of a circuit for providing the second low level pulse signal in FIG. 1. FIG. 4 is a circuit diagram for providing the high level pulse signal in FIG. 1.

As shown in FIGS. 2-4, three circuits use a total of 28 transistors and 7 capacitors, and each circuit is driven by different clocks and input signals. Due to the large number of circuit elements, structure complexity and large area occupied, it is relatively difficult to apply applied to a display with narrow bezel.

Figure 5:
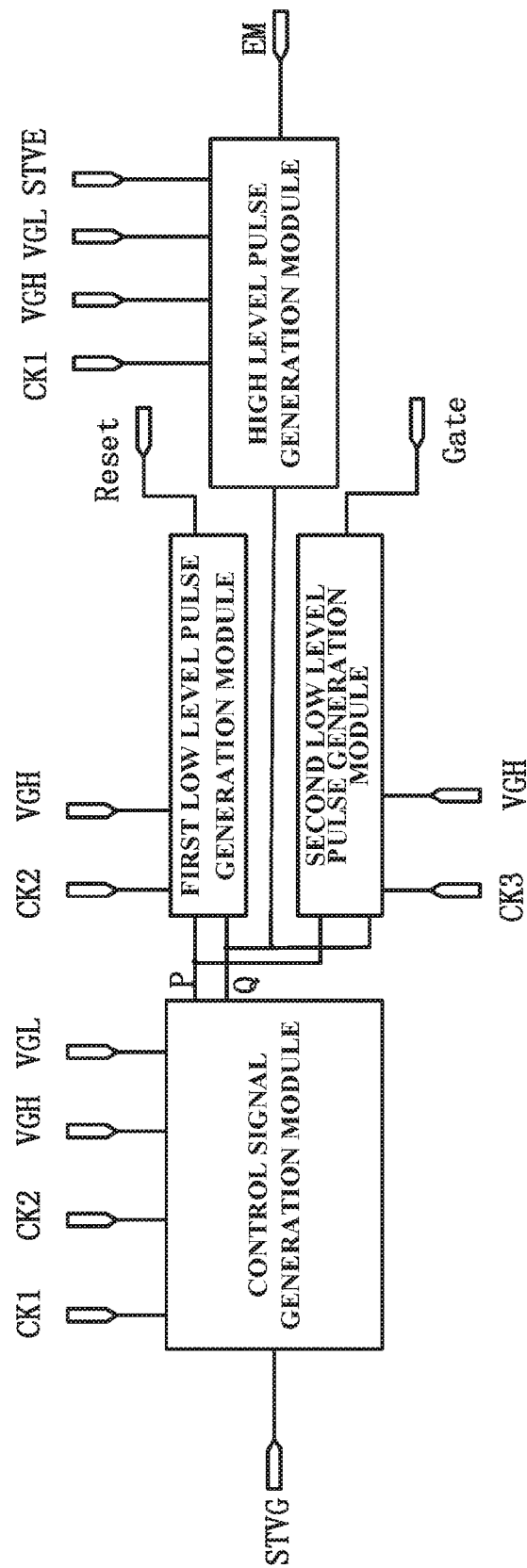
FIG. 5 is a schematic block diagram of a shift register according to embodiments of the present disclosure.

FIG. 5 is a schematic block diagram of a shift register according to embodiments of the present disclosure. As shown in FIG. 5, the shift register includes a control signal generation module, a first low level pulse generation module, a second low level pulse generation module, and a high level pulse generation module. The control signal generation module is connected to a first clock terminal CK1, a second clock terminal CK2, a first voltage terminal VGH, a second voltage terminal VGL, and a first input terminal STVG, and is configured to generate a first control signal and a second control signal. The first control signal and the second control signal are output to the first low level pulse generation module, the second low level pulse generation module, and the high level pulse generation module.

The first low level pulse generation module is connected to the second clock terminal CK2 and the first voltage terminal VGH, and is configured to receive the first control signal and the second control signal from the control signal generation module and generate a first low level pulse signal. The second low level pulse generation module is connected to the third clock terminal CK3 and the first voltage terminal VGH, and is configured to receive the first control signal and the second control signal from the control signal generation module and generate a second low level pulse signal. The high level pulse generation module is connected to the first clock terminal CK1, the first voltage terminal VGH, a second voltage terminal VGL, and a second input terminal STVE, and is configured to receive the first control signal from the control signal generation module, and generate a high level pulse signal.

In the shift register of the present embodiment, for the three pulse generation modules, the reuse of the control signals is achieved, and the number of circuit elements used in the shift register can be reduced.

Figure 6:
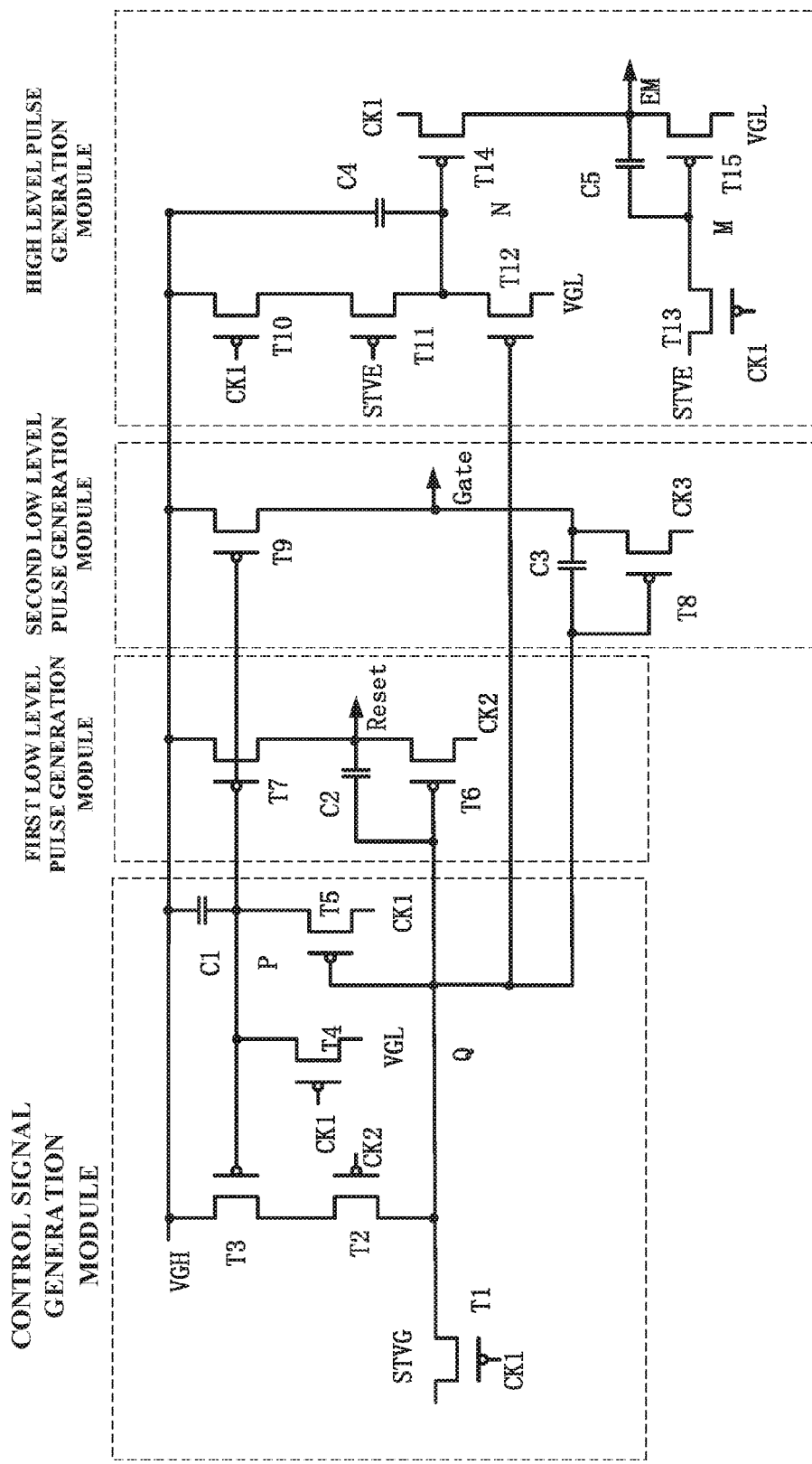
FIG. 6 is an exemplary circuit diagram for explaining the shift register shown in FIG. 5.

FIG. 6 is a schematic circuit diagram for explaining the shift register shown in FIG. 5. As shown in FIG. 6, the control signal generation module includes a first transistor T1, a second transistor T2, a third transistor T3, a fourth transistor T4, a fifth transistor T5, and a first capacitor C1.

The control electrode of the first transistor T1 is connected to the first clock terminal CK1, the first electrode thereof is connected to the first input terminal STVG, and the second electrode thereof is connected to the second electrode of the second transistor T2. The control electrode of the second transistor T2 is connected to the second clock terminal CK2, the first electrode thereof is connected to the second electrode of the third transistor T3, and the second electrode thereof is connected to the second electrode of the first transistor T1. The control electrode of the third transistor T3 is connected to the first electrode of the fourth transistor T4, the first electrode thereof is connected to the first voltage terminal VGH, and the second electrode thereof is connected to the first electrode of the second transistor T2. The control electrode of the fourth transistor T4 is connected to the first clock terminal CK1, the first electrode thereof is connected to the control electrode of the third transistor T3, and the second electrode thereof is connected to the second voltage terminal VGL. The control electrode of the fifth transistor T5 is connected to the second electrode of the first transistor T1, the first electrode thereof is connected to the control electrode of the third transistor T3, and the second electrode thereof is connected to the first clock terminal CK1. The first capacitor C1 is connected between the first voltage terminal VGH and the control electrode of the third transistor T3. The connection point of the second electrode of the first transistor T1 and the second electrode of the second transistor T2 forms a first control signal output terminal Q. The control point of the control electrode of the third transistor T3 and the first electrode of the fourth transistor T4 forms a second control signal output terminal P.

The first low level pulse generation module includes a sixth transistor T6, a seventh transistor T7, and a second capacitor C2. The control electrode of the sixth transistor T6 is connected to the first control signal output terminal Q, i.e., is configured to receive the first control signal, the first electrode of the sixth transistor T6 is connected to the second electrode of the seventh transistor T7, and the second electrode thereof is connected to the second clock terminal CK2. The control electrode of the seventh transistor T7 is connected to the second control signal output terminal P, i.e., is configured to receive the second control signal, the first electrode of the seventh transistor T7 is connected to the first voltage terminal VGH, and the second electrode thereof is connected to the first electrode of the sixth transistor T6. The second capacitor C2 is connected between the first electrode of the sixth transistor T6 and the control electrode of the sixth transistor T6. The connection point of the first electrode of the sixth transistor T6 and the second electrode of the seventh transistor T7 forms a first low level pulse output terminal Reset configured to output the first low level pulse signal.

The second low level pulse generation module includes an eighth transistor T8, a ninth transistor T9, and a third capacitor C3. The control electrode of the eighth transistor T8 is connected to the first control signal output terminal Q, i.e., is configured to receive the first control signal, the first electrode of the eighth transistor T8 is connected to the second electrode of the ninth transistor T9, and the second electrode thereof is connected to the third clock terminal CK3. The control electrode of the ninth transistor T9 is connected to the second control signal output terminal P, i.e., is configured to receive the second control signal, the first electrode of the ninth transistor T9 is connected to the first voltage terminal VGH, and the second electrode thereof is connected to the first electrode of the eighth transistor T8. The third capacitor C3 is connected between the first electrode of the eighth transistor T8 and the gate of the eighth transistor T8. The connection point of the first electrode of the eighth transistor T8 and the second electrode of the ninth transistor T9 forms a second low level pulse output terminal Gate configured to output the second low level pulse signal.

The high level pulse generation module includes a tenth transistor T10, an eleventh transistor T11, a twelfth transistor T12, a thirteenth transistor T13, a fourteenth transistor T14, a fifteenth transistor T15, a fourth capacitor C4, and a fifth capacitor C5. The control electrode of the tenth transistor T10 is connected to the first clock terminal CK1, the first electrode thereof is connected to the first voltage terminal VGH, and the second electrode thereof is connected to the first electrode of the eleventh transistor T11. The control electrode of the eleventh transistor T11 is connected to the second input terminal STVE, the first electrode thereof is connected to the second electrode of the tenth transistor T10, and the second electrode thereof is connected to the first electrode of the twelfth transistor T12. The control electrode of the twelfth transistor T12 is connected to the first control signal output terminal Q, i.e., is configured to receive the first control signal, the first electrode of the twelfth transistor T12 is connected to the second electrode of the eleventh transistor T11, and the second electrode thereof is connected to the second voltage terminal VGL. The control electrode of the thirteenth transistor T13 is connected to the first clock terminal CK1, the first electrode thereof is connected to the second input terminal STVE, and the second electrode thereof is connected to the control electrode of the fifteenth transistor T15. The control electrode of the fourteenth transistor T14 is connected to the second electrode of the eleventh transistor T11, the first electrode thereof is connected to the first clock terminal CK1, and the second electrode thereof is connected to the first electrode of the fifteenth transistor T15. The control electrode of the fifteenth transistor T15 is connected to the second electrode of the thirteenth transistor T13, the first electrode thereof is connected to the second electrode of the fourteenth transistor T14, and the second electrode thereof is connected to the second voltage terminal VGL. The fourth capacitor C4 is connected between the first voltage terminal VGH and the control electrode of the fourteenth transistor T14. The fifth capacitor C5 is connected between the first electrode of the fifteenth transistor T15 and the control electrode of the fifteenth transistor T15. The connection point of the second electrode of the fourteenth transistor T14 and the first electrode of the fifteenth transistor T15 forms a high level pulse output terminal EM configured to output the high level pulse signal.

Point N indicates the connection point of the first electrode of the twelfth transistor T12, the control electrode of the fourteenth transistor T14 and the second electrode of the fourth capacitor C4. Point M indicates the connection point of the second electrode of the thirteenth transistor T13, the control electrode of the fifteenth transistor T15 and the second electrode of the fifth capacitor C5.

In the shift register of the present embodiment, the three pulse generation modules are implemented using fewer circuit elements, and the number of circuit elements used in the shift register can be reduced.

Figure 7:
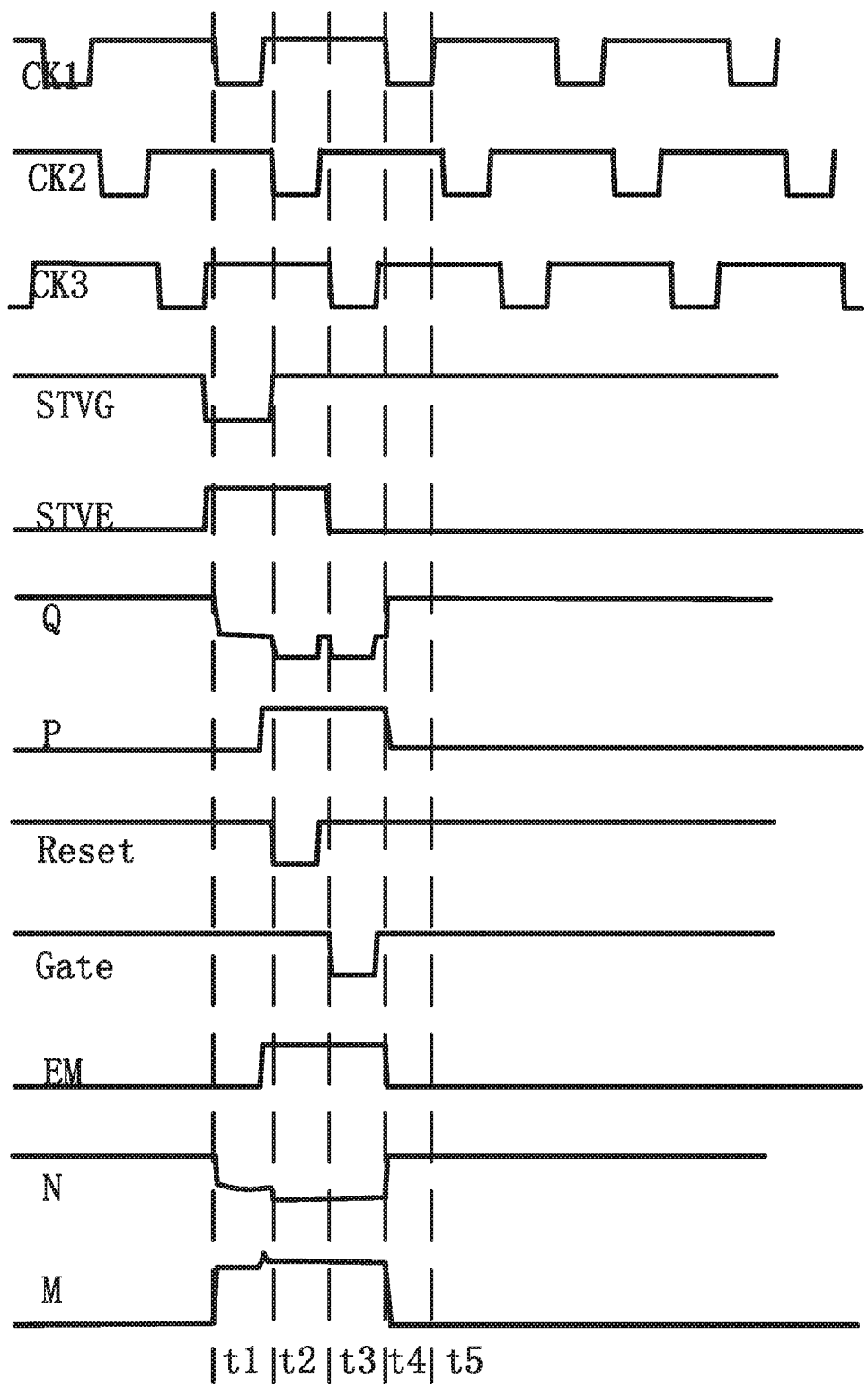
FIG. 7 is a schematic diagram for explaining the operation timing sequence of the shift register shown in FIG. 6.

FIG. 7 is a schematic diagram for explaining the operation timing sequence of the shift register shown in FIG. 6. As shown in FIG. 7, the operation timing sequence of the shift register in this embodiment includes the first phase, the second phase, the third phase, and the fourth phase. Hereinafter, the states of the signals and the transistors in each stage will be described, by taking the transistors in the shift register as a P-type thin film transistor TFT as an example, and in this embodiment, VL is used to represent the low level voltage provided by the clock terminal, the input terminal and the second voltage terminal VGL, and VH is used to represent the high level voltage provided by the clock terminal, the input terminal and the first voltage terminal VGH. In FIG. 7, the signal of the first clock terminal CK1, the signal of the second clock terminal CK2 and the signal of the third clock terminal CK3 are clock signals with periodically switched high and low levels, and the duty cycle of the low level is 33%.

In the first phase, a low level signal is provided at the first clock terminal, a high level signal is provided at the second clock terminal, a high level signal is provided at the third clock terminal, a low level signal is provided at the first input terminal, and a high level signal is provided at the second input terminal, such that the shift register outputs a first low level pulse signal with high level, a second low level pulse signal with high level and a high level pulse signal with low level.

Specifically, in the first phase t1, the voltages of the first input terminal STVG and the first clock terminal CK1 jump to a low level, the first transistor T1 is turned on, and the voltage with low level at the first input terminal STVG is transmitted to the first control signal output terminal Q. Since there is a threshold loss when the P-type TFT delivers a low level, the voltage at the first control signal output terminal Q is the sum of the VL and the absolute value of threshold voltage Vthp of the first transistor T1. The sixth transistor T6 is turned on, and since the voltage at the second clock terminal CK2 is at a high level at this time, the voltage at the first low level pulse output terminal Reset is at a high level. At the same time, since the voltage at the first clock terminal CK1 is at a low level, the fourth transistor T4 is turned on to pull down the voltage at the second control signal output terminal P, and the eighth transistor T8 and the ninth transistor T9 are turned on to pull up the low level pulse output terminal Reset and the second low level pulse output terminal Gate. The thirteenth transistor T13 is turned on, and since the voltage at the second input terminal STVE in the first phase t1 goes to a high level, the voltage at the point M goes to a high level, and the fifteenth transistor T15 is turned off. At the same time, since the voltage at the first control signal output terminal Q is pulled down, the twelfth transistor T12 is turned on to pull down the voltage at the point N, the fourteenth transistor T14 is turned on, and the high level pulse output terminal EM outputs the same low level voltage as the first clock terminal CK1.

In the second phase, a high level signal is provided at the first clock terminal, a low level signal is provided at the second clock terminal, a high level signal is provided at the third clock terminal, a high level signal is provided at the first input terminal, a high level signal is provided at the second input terminal, such that the shift register outputs a first low level pulse signal with low level, a second low level pulse signal with high level and a high level pulse signal with high level.

Specifically, in the second phase t2, the voltages of the first input terminal STVG and the first clock terminal CK1 jump to a high level, and the voltage at the second clock terminal CK2 jumps to a low level. Since the sixth transistor T6 is turned on in the first phase t1, the low level voltage at the second clock terminal CK2 is transmitted to the first control signal output terminal Q through the sixth transistor T6, the fifth transistor T5 is turned on, the voltage at the second control signal output terminal P is pulled up to the high level of the voltage at the first clock terminal CK1. The third transistor T3, the eighth transistor T8, and the ninth transistor T9 are turned off. Since the first transistor T1 is also in the off state, the gate of the sixth transistor T6 is in a floating state, and the voltage across the second capacitor C2 cannot jump abruptly (the voltage thereof can be expressed as: VL+|Vthp|−VH). Therefore, the level of the voltage at the first low level pulse output terminal Reset decreases as the level of the voltage at the first control signal output terminal Q decreases, and finally gets stable (the voltage thereof can be expressed as: 2VL+|Vthp|−VH). The third transistor T3 operates in the linear region, the voltage with low level of the second clock terminal CK2 is transmitted to the first low level pulse output terminal Reset without threshold loss, and the voltage at the first low level pulse output terminal Reset is a voltage with low level. The voltage with low level of the first control signal output terminal Q also allows the twelfth transistor T12 to operate in the linear region, the voltage at the point N is a voltage with low level, the fourteenth transistor T14 is well turned on to output the voltage with high level of the first clock terminal CK1 to the high level pulse signal output terminal EM. The voltage with low level of the first control signal output terminal Q also turns on the seventh transistor T7 and outputs the voltage with high level of the third clock terminal CK3 to the second low level pulse output terminal Gate.

In the third phase, a high level signal is provided at the first clock terminal, a high level signal is provided at the second clock terminal, a low level signal is provided at the third clock terminal, a high level signal is provided at the first input terminal, a low level signal is provided at the second input, such that the shift register outputs a first low level pulse signal with high level, a second low level pulse signal with low level and a high level pulse signal with high level.

Specifically, in the third phase t3, the voltage at the second clock terminal CK2 jumps to a high level, and the voltage at the third clock terminal CK3 jumps to a low level. Since the voltage across the capacitor C2 cannot be abruptly changed, and the voltage at the second clock terminal CK2 jumps at a level opposite to that for the voltage at the third clock terminal CK3, the voltage at the first control signal output terminal Q is still 2VL+|Vthp|−VH. The sixth transistor T6, the seventh transistor T7 and the twelfth transistor T12 are all operating in the linear region. The sixth transistor T6 transmits the voltage with high level at the second clock terminal CK2 to the first low level pulse output terminal Reset, pulls up the first low level pulse output terminal Reset. The seventh transistor T7 transmits the voltage with low level at the third clock terminal CK3 to the second low level pulse output terminal Gate without threshold loss. The twelfth transistor T12 still remains the voltage of the point N at a low level, such that the fourteenth transistor T14 transmits the voltage with high level at the first clock terminal CK1 to the high level pulse signal output terminal EM, appropriately.

In the fourth phase, a low level signal is provided at the first clock terminal, a high level signal is provided at the second clock terminal, a high level signal is provided at the third clock terminal, a high level signal is provided at the first input terminal, a low level signal is provided at the second input terminal, such that the shift register outputs a first low level pulse signal with high level, a second low level pulse signal with high level and a high level pulse signal with low level.

Specifically, in the fourth phase t4, the voltage at the third clock terminal CK3 jumps to a high level, and the voltages of the first clock terminal CK1 and the second input terminal STVE jump to a low level. Since the voltage at the first clock terminal CK1 is at a low level, the fourth transistor T4 is turned on to pull down the voltage at the second control signal output terminal P to a low level. The eighth transistor T8 and the ninth transistor T9 are turned on to pull up the voltage at the second low level pulse output terminal Gate to a high level. The voltage at the first low level pulse output terminal Reset is maintained at a low level. At the same time, the first clock terminal CK1 and the second input terminal STVE jump to a low level, the thirteenth transistor T13 is turned on to pull down the voltage at the point M to a low level. The fifteenth transistor T15 is turned on, the voltage at the high level pulse output terminal EM is pulled to a low level. Since the voltage across the capacitor C4 cannot be abruptly changed, and the voltage at the high level pulse output terminal EM goes to a low level, the point M will be pulled to a lower level, and the voltage with low level at the second voltage terminal VGL can be transmitted to the high level pulse output terminal EM through the fifteenth transistor T15 without threshold loss.

After the completion of the operation timing sequence, it proceeds into the fifth phase t5 of the non-operation state, the fifth phase t5 being longer than the above four stages in time length.

In the fifth phase t5, a signal that periodically changes between the high level and the low level is provided at the first clock terminal CK1, and a signal that periodically changes between the high level and the low level is provided at the second clock terminal CK2, a signal that periodically changes between the high level and the low level is provided at the third clock terminal CK3, a high level signal is provided at the first input terminal STVG, and a low level signal is provided at the second input terminal STVE, such that the shift register outputs a first low level pulse signal with high level, a second low level pulse signal with high level, and a high level pulse signal with low level.

Specifically, in the fifth phase t5, the first transistor T1 and the second transistor T2 are periodically turned on with the periodic change of the voltages of the first clock terminal CK1 and the second clock terminal CK2, such that the voltage at the first control signal output terminal Q is stably maintained at a high level. The fourth transistor T4 is periodically turned on by the change in the voltage at the first clock terminal CK1, and the first capacitor C1 has the effect of holding the voltage, such that the voltage at the second control signal output terminal P is maintained at a low level. The thirteenth transistor T13 is periodically turned on by the change in the voltage at the first clock terminal CK1, and the voltage at the point M is maintained at a low level. The tenth transistor T10 is periodically turned on by the change in the voltage at the first clock terminal CK1, and since the fourth capacitor C4 has the effect of holding the voltage, the voltage at the point N is maintained at a high level. The voltage with high level at the first control signal output terminal Q, the voltage with low level of the second control signal output terminal P, the voltage with low level of the point M, and the voltage with high level of the point N allow to keep the voltages of the first low level pulse output terminal Reset and the second low level pulse output terminal Gate at a high level, and the voltage at the high level pulse output terminal EM at a low level.

Figure 8:
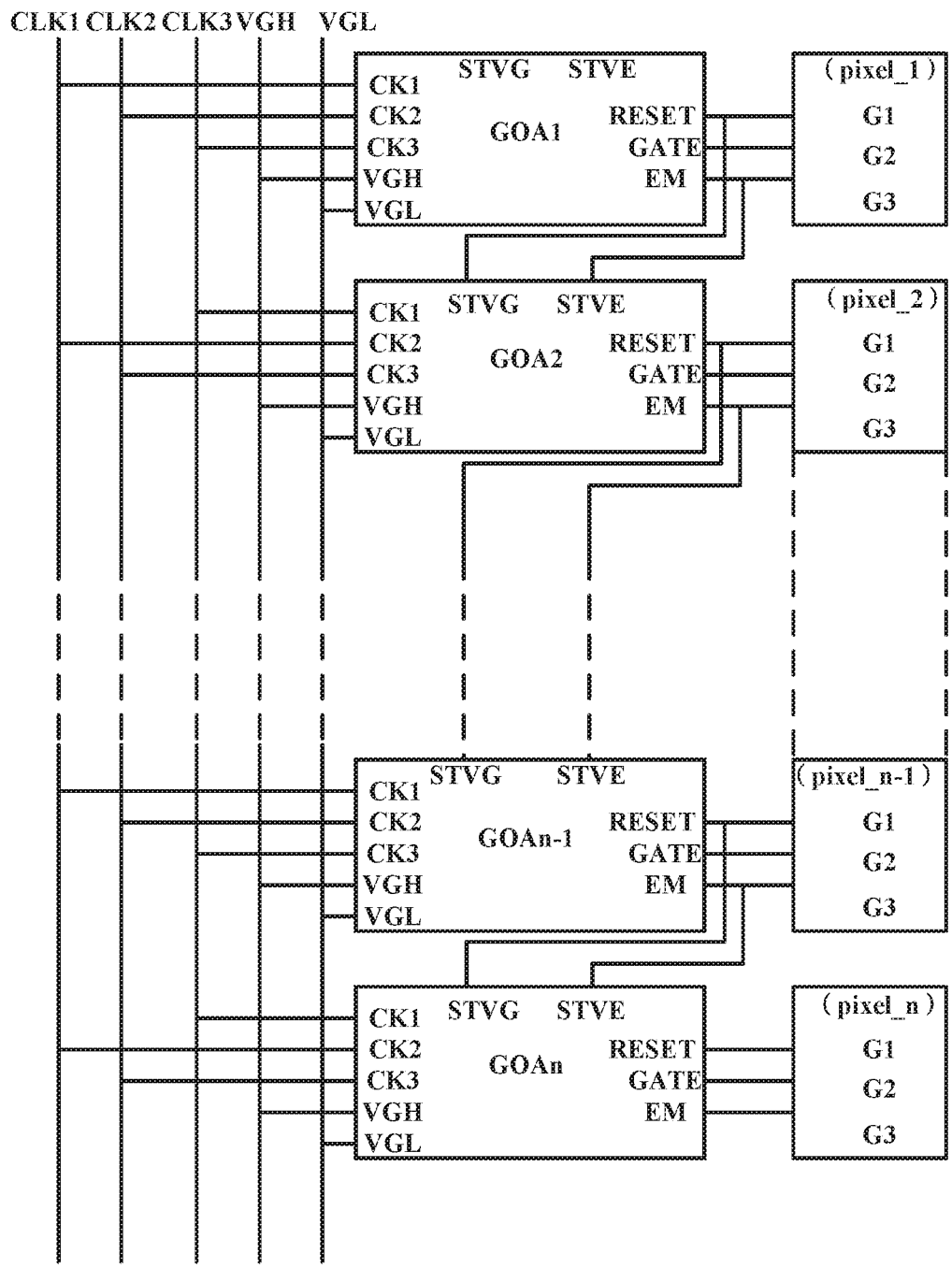
FIG. 8 is a schematic block diagram of a gate driving circuit of embodiments of the present disclosure.

FIG. 8 is a schematic block diagram of a gate driving circuit of one embodiment of the present disclosure. As shown in FIG. 8, the plurality of shift register GOAs described above are used in cascade to form a gate driving circuit. The first low level pulse output terminal Reset, the second low level pulse output terminal Gate and the high level pulse output terminal EM of each stage shift register is connected to the pixel cell circuit pixel to provide the pulse signals G1, G2, G3, which is necessary for writing data to the pixel cell circuit. Between the cascaded shift registers, the first low level pulse output terminal Reset of the shift register in a previous stage is connected to the first input terminal STVG of the shift register in a next stage, and the high level pulse output terminal EM of the shift register in a previous stage is connected to the second input terminal STVE of the shift register in a next stage.

Figure 9:
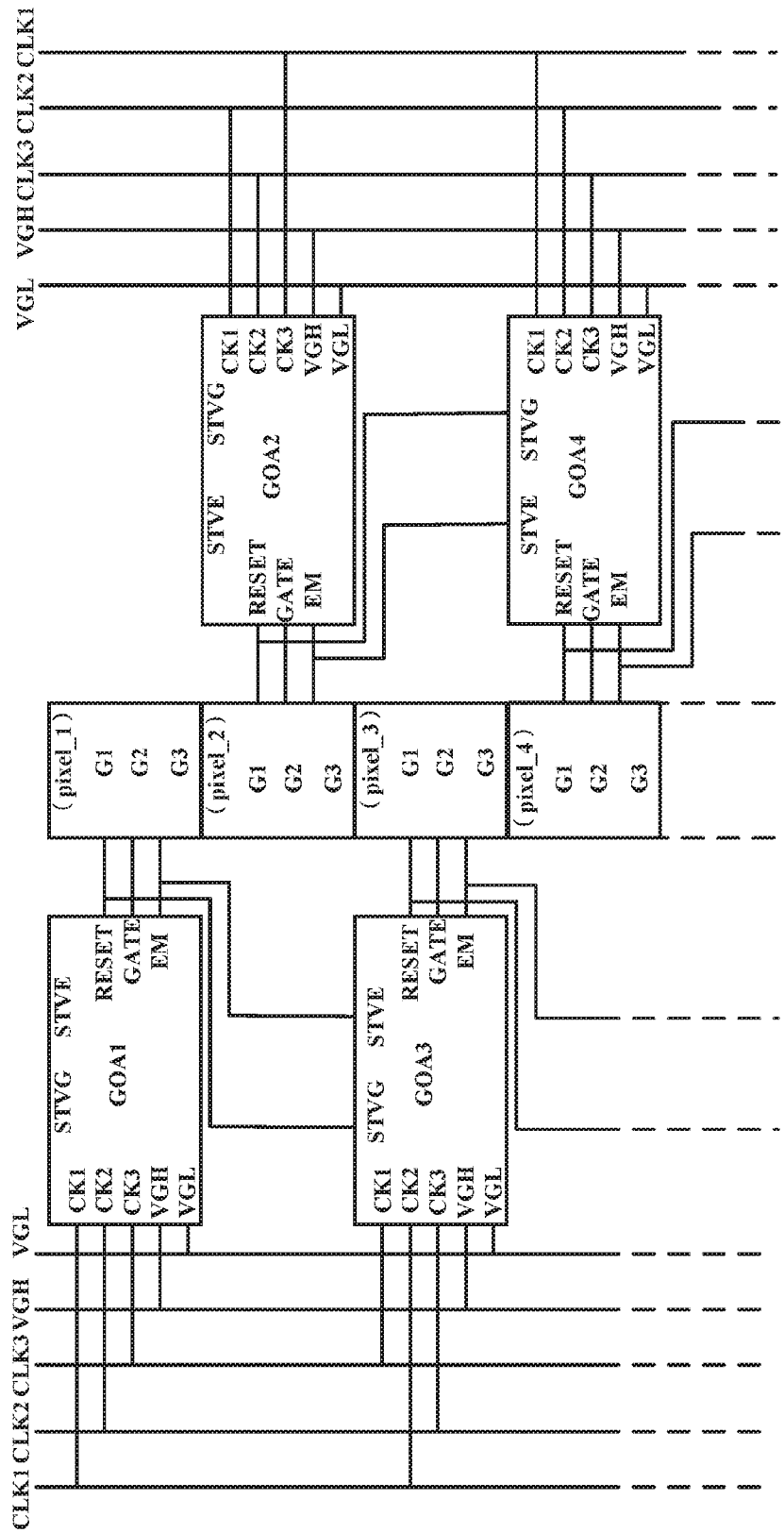
FIG. 9 is a schematic block diagram of a gate driving circuit of another embodiment of the present disclosure.

FIG. 9 is a circuit block diagram of a gate driving circuit of another embodiment of the present disclosure. The circuit differs from the circuit shown in FIG. 8 in that the gate driving circuit of this embodiment includes two columns of shift registers in cascade, and the two columns of shift registers in cascade are used alternately. Specifically, in this embodiment, the first low level pulse output terminal Reset of the shift register in the first stage is connected to the first input terminal STVG of the shift register in the third stage, the high level pulse output terminal EM of the shift register in the first stage is connected to the second input terminal STVE of the shift register in the third stage. The first low level pulse output terminal Reset of the shift register in the second stage is connected to the first input terminal STVG of the shift register in the fourth stage, the high level pulse output terminal EM of the shift register in the second stage is connected to the second input terminal STVE of the shift register in the fourth stage. And so on, with the alternate use of the multi-column cascaded shift registers, the interval of the operation between the adjacent two-stage shift registers is shortened, and the scanning speed of the pixel driving circuit for the pixel unit is improved.

Embodiments of the present disclosure further provide a display device including the above-described gate driving circuit. The display device may be any product or component having a display function such as a liquid crystal panel, an electronic paper, an OLED panel, a mobile phone, a tablet computer, a television set, a display, a notebook computer, a digital photo frame, a navigator, or the like.

In embodiments of the present disclosure, one shift register circuit is used to implement the generation of three pulse signals, so as to reduce the number of circuit elements, reduce the total of 28 transistors and 7 capacitors to 15 transistors and 5 capacitors, and reduce the number of control signals. The shift registers may be used in cascade to obtain a gate driving circuit with fewer circuit elements to meet the requirements of the display with narrow bezel.

It should be noted that, in the above description, the high level and the low level are only used to distinguish whether the voltage can turn on the transistors, and do not limit the value of voltage. For example, a low level may refer to a ground level or a negative level. In addition, the selected P-type TFT transistor is schematically illustrated and is not specifically limited to the type of transistor. According to the principles of this disclosure, those skilled in the art will be able to make appropriate selections and adjustments of the type of transistor without the need for creative work, and these selections and adjustments are also considered to be within the scope of protection of the present disclosure.

It is to be understood that the above embodiments are merely illustrative embodiments for the purpose of illustrating the principles of the present disclosure, but the present disclosure is not limited thereto. Those of ordinary skill in the art may make various changes and modifications without departing from the spirit and substance of the present disclosure, which are also considered to be within the scope of protection of the present disclosure.

What is claimed is:

1. A shift register comprising:
   a control signal generation module;
   a first low level pulse generation module;
   a second low level pulse generation module; and
   a high level pulse generation module;
   wherein the control signal generation module is connected to a first clock terminal, a second clock terminal, a first voltage terminal, a second voltage terminal and a first input terminal, and is configured to generate a first control signal and a second control signal;
   wherein the first low level pulse generation module is connected to the second clock terminal and the first voltage terminal, and is configured to receive the first control signal and the second control signal from the control signal generation module, and generate a first low level pulse signal;
   wherein the second low level pulse generation module is connected to a third clock terminal and the first voltage terminal, and is configured to receive the first control signal and the second control signal from the control signal generation module, and generate a second low level pulse signal; and
   wherein the high level pulse generation module is connected to the first clock terminal, the first voltage terminal, the second voltage terminal and a second input terminal, and is configured to receive the first control signal from the control signal generation module, and generate a high level pulse signal.

2. The shift register according to claim 1,
   wherein the control signal generation module comprises a first transistor, a second transistor, a third transistor, a fourth transistor, a fifth transistor, and a first capacitor;
   wherein a control electrode of the first transistor is connected to the first clock terminal, a first electrode of the first transistor is connected to the first input terminal, and a second electrode of the first transistor is connected to a second electrode of the second transistor;
   wherein a control electrode of the second transistor is connected to the second clock terminal, a first electrode of the second transistor is connected to a second electrode of the third transistor, and a second electrode of the second transistor is connected to the second electrode of the first transistor;
   wherein a control electrode of the third transistor is connected to a first electrode of the fourth transistor, a first electrode of the third transistor is connected to the first voltage terminal, and a second electrode of the third transistor is connected to the first electrode of the second transistor;
   wherein a control electrode of the fourth transistor is connected to the first clock terminal, a first electrode of the fourth transistor is connected to the control electrode of the third transistor, and a second electrode of the fourth transistor is connected to the second voltage terminal;
   wherein a control electrode of the fifth transistor is connected to the second electrode of the first transistor, a first electrode of the fifth transistor is connected to the control electrode of the third transistor, and a second electrode of the fifth transistor is connected to the first clock terminal;
   wherein the first capacitor is connected between the first voltage terminal and the control electrode of the third transistor;

wherein a connection point of the second electrode of the first transistor and the second electrode of the second transistor forms a first control signal output terminal configured to output the first control signal; and wherein a connection point of the control electrode of the third transistor and the first electrode of the fourth transistor forms a second control signal output terminal configured to output the second control signal.

3. The shift register according to claim 1,
wherein the first low level pulse generation module comprises a sixth transistor, a seventh transistor, and a second capacitor;
wherein a control electrode of the sixth transistor is configured to receive the first control signal, a first electrode of the sixth transistor is connected to a second electrode of the seventh transistor, and a second electrode of the sixth transistor is connected to the second clock terminal;
wherein a control electrode of the seventh transistor is configured to receive the second control signal, a first electrode of the seventh transistor is connected to the first voltage terminal, and a second electrode of the seventh transistor is connected to the first electrode of the sixth transistor;
wherein the second capacitor is connected between the first electrode of the sixth transistor and the control electrode of the sixth transistor; and
wherein a connection point of the first electrode of the sixth transistor and the second electrode of the seventh transistor forms a first low level pulse output terminal configured to output the first low level pulse signal.

4. The shift register according to claim 1,
wherein the second low level pulse generation module comprises an eighth transistor, a ninth transistor, and a third capacitor;
wherein a control electrode of the eighth transistor is configured to receive the first control signal, a first electrode of the eighth transistor is connected to a second electrode of the ninth transistor, and a second electrode of the eighth transistor is connected to the third clock terminal;
wherein a control electrode of the ninth transistor is configured to receive the second control signal, a first electrode of the ninth transistor is connected to the first voltage terminal, and the second electrode of the ninth transistor is connected to the first electrode of the eighth transistor;
wherein the third capacitor is connected between the first electrode of the eighth transistor and the control electrode of the eighth transistor; and
wherein the connection point of the first electrode of the eighth transistor and the second electrode of the ninth transistor forms a second low level pulse output terminal configured to output the second low level pulse signal.

5. The shift register according to claim 1,
wherein the high level pulse generation module comprises a tenth transistor, an eleventh transistor, a twelfth transistor, a thirteenth transistor, a fourteenth transistor, a fifteenth transistor, a fourth capacitor, and a fifth capacitor;
wherein a control electrode of the tenth transistor is connected to the first clock terminal, a first electrode of the tenth transistor is connected to the first voltage terminal, and a second electrode of the tenth transistor is connected to a first electrode of the eleventh transistor;

wherein a control electrode of the eleventh transistor is connected to the second input terminal, the first electrode of the eleventh transistor is connected to the second electrode of the tenth transistor, and a second electrode of the eleventh transistor is connected to a first electrode of the twelfth transistor;
wherein a control electrode of the twelfth transistor is configured to receive the first control signal, the first electrode of the twelfth transistor is connected to the second electrode of the eleventh transistor, and a second electrode of the twelfth transistor is connected to the second voltage terminal;
wherein the control electrode of the thirteenth transistor is connected to the first clock terminal, a first electrode of the thirteenth is connected to the second input terminal, and a second electrode of the thirteenth is connected to a control electrode of the fifteenth transistor;
wherein a control electrode of the fourteenth transistor is connected to the second electrode of the eleventh transistor, a first electrode of the fourteenth transistor is connected to the first clock terminal, and a second electrode of the fourteenth transistor is connected to a first electrode of the fifteenth transistor;
wherein a control electrode of the fifteenth transistor is connected to the second electrode of the thirteenth transistor, the first electrode of the fifteenth transistor is connected to the second electrode of the fourteenth transistor, and a second electrode of the fifteenth transistor is connected to the second voltage terminal;
wherein the fourth capacitor is connected between the first voltage terminal and the control electrode of the fourteenth transistor;
wherein the fifth capacitor is connected between the first electrode of the fifteenth transistor and the control electrode of the fifteenth transistor; and
wherein the connection point of the second electrode of the fourteenth transistor and the first electrode of the fifteenth transistor forms a high level pulse output terminal configured to output the high level pulse signal.

6. A method for driving the shift register according to claim 1, comprising:
in a first phase, providing a low level signal at a first clock terminal, a high level signal at a second clock terminal, a high level signal at a third clock terminal, a low level signal at a first input terminal, and a high level signal at a second input terminal, such that the shift register outputs a first low level pulse signal with high level, a second low level pulse signal with high level, and a high level pulse signal with low level;
in a second phase, providing a high level signal at the first clock terminal, a low level signal at the second clock terminal, a high level signal at the third clock terminal, a high level signal at the first input terminal, and a high level signal at the second input terminal, such that the shift register outputs a first low level pulse signal with low level, a second low level pulse signal with high level, and a high level pulse signal with high level;
in a third phase, providing a high level signal at the first clock terminal, a high level signal at the second clock terminal, a low level signal at the third clock terminal, a high level signal at the first input terminal, and a low level signal at the second input terminal, such that the shift register outputs a first low level pulse signal with high level; a second low level pulse signal with low level, and a high level pulse signal with high level;

in a fourth phase, providing a low level signal at the first clock terminal, a high level signal at the second clock terminal, a high level signal at the third clock terminal, a high level signal at the first input terminal, and a low level signal at the second input terminal, such that the shift register outputs a first low level pulse signal with high level, a second low level pulse signal with high level, and a high level pulse signal with low level.

7. The method for driving the shift register according to claim 6,
wherein the control signal generation module comprises a first transistor, a second transistor, a third transistor, a fourth transistor, a fifth transistor, and a first capacitor;
wherein a control electrode of the first transistor is connected to the first clock terminal, a first electrode of the first transistor is connected to the first input terminal, and a second electrode of the first transistor is connected to a second electrode of the second transistor;
wherein a control electrode of the second transistor is connected to the second clock terminal, a first electrode of the second transistor is connected to a second electrode of the third transistor, and a second electrode of the second transistor is connected to the second electrode of the first transistor;
wherein a control electrode of the third transistor is connected to a first electrode of the fourth transistor, a first electrode of the third transistor is connected to the first voltage terminal, and a second electrode of the third transistor is connected to the first electrode of the second transistor;
wherein a control electrode of the fourth transistor is connected to the first clock terminal, a first electrode of the fourth transistor is connected to the control electrode of the third transistor, and a second electrode of the fourth transistor is connected to the second voltage terminal;
wherein a control electrode of the fifth transistor is connected to the second electrode of the first transistor, a first electrode of the fifth transistor is connected to the control electrode of the third transistor, and a second electrode of the fifth transistor is connected to the first clock terminal;
wherein the first capacitor is connected between the first voltage terminal and the control electrode of the third transistor;
wherein a connection point of the second electrode of the first transistor and the second electrode of the second transistor forms a first control signal output terminal configured to output the first control signal; and
wherein a connection point of the control electrode of the third transistor and the first electrode of the fourth transistor forms a second control signal output terminal configured to output the second control signal.

8. The method for driving the shift register according to claim 6,
wherein the first low level pulse generation module comprises a sixth transistor, a seventh transistor, and a second capacitor;
wherein a control electrode of the sixth transistor is configured to receive the first control signal, a first electrode of the sixth transistor is connected to a second electrode of the seventh transistor, and a second electrode of the sixth transistor is connected to the second clock terminal;
wherein a control electrode of the seventh transistor is configured to receive the second control signal, a first electrode of the seventh transistor is connected to the first voltage terminal, and a second electrode of the seventh transistor is connected to the first electrode of the sixth transistor;
wherein the second capacitor is connected between the first electrode of the sixth transistor and the control electrode of the sixth transistor; and
wherein a connection point of the first electrode of the sixth transistor and the second electrode of the seventh transistor forms a first low level pulse output terminal configured to output the first low level pulse signal.

9. The method for driving the shift register according to claim 6,
wherein the second low level pulse generation module comprises an eighth transistor, a ninth transistor, and a third capacitor;
wherein a control electrode of the eighth transistor is configured to receive the first control signal, a first electrode of the eighth transistor is connected to a second electrode of the ninth transistor, and a second electrode of the eighth transistor is connected to the third clock terminal;
wherein a control electrode of the ninth transistor is configured to receive the second control signal, a first electrode of the ninth transistor is connected to the first voltage terminal, and the second electrode of the ninth transistor is connected to the first electrode of the eighth transistor;
wherein the third capacitor is connected between the first electrode of the eighth transistor and the control electrode of the eighth transistor; and
wherein the connection point of the first electrode of the eighth transistor and the second electrode of the ninth transistor forms a second low level pulse output terminal configured to output the second low level pulse signal.

10. The method for driving the shift register according to claim 6,
wherein the high level pulse generation module comprises a tenth transistor, an eleventh transistor, a twelfth transistor, a thirteenth transistor, a fourteenth transistor, a fifteenth transistor, a fourth capacitor, and a fifth capacitor;
wherein a control electrode of the tenth transistor is connected to the first clock terminal, a first electrode of the tenth transistor is connected to the first voltage terminal, and a second electrode of e h transistor is connected to a first electrode of the eleventh transistor;
wherein a control electrode of the eleventh transistor is connected to the second input terminal, the first electrode of the eleventh transistor is connected to the second electrode of the tenth transistor, and a second electrode of the eleventh transistor is connected to a first electrode of the twelfth transistor;
wherein a control electrode of the twelfth transistor is configured to receive the first control signal, the first electrode of the twelfth transistor is connected to the second electrode of the eleventh transistor, and a second electrode of the twelfth transistor is connected to the second voltage terminal;
wherein the control electrode of the thirteenth transistor is connected to the first clock terminal, a first electrode of the thirteenth is connected to the second input terminal, and a second electrode of the thirteenth is connected to a control electrode of the fifteenth transistor;
wherein a control electrode of the fourteenth transistor is connected to the second electrode of the eleventh transistor, a first electrode of the fourteenth transistor is connected to the first clock terminal, and a second electrode of the fourteenth transistor is connected to a first electrode of the fifteenth transistor;

wherein a control electrode of the fifteenth transistor is connected to the second electrode of the thirteenth transistor, the first electrode of the fifteenth transistor is connected to the second electrode of the fourteenth transistor, and a second electrode of the fifteenth transistor is connected to the second voltage terminal;

wherein the fourth capacitor is connected between the first voltage terminal and the control electrode of the fourteenth transistor;

wherein the fifth capacitor is connected between the first electrode of the fifteenth transistor and the control electrode of the fifteenth transistor; and wherein the connection point of the second electrode of the fourteenth transistor and the first electrode of the fifteenth transistor forms a high level pulse output terminal configured to output the high level pulse signal.

11. A gate driving circuit comprising a plurality of shift registers according to claim 1 in cascade, wherein each of the shift registers provides a first low level pulse signal, a second low level pulse signal, and a high level pulse signal;

wherein the shift register in a previous stage provides the first low level pulse signal to the first input terminal of the shift register in a next stage, and the shift register in a previous stage provides the high level pulse signal to the second input terminal of the shift register in a next stage.

12. A display device comprising the gate driving circuit according to claim 11.

13. The gate driving circuit according to claim 11, wherein the control signal generation module comprises a first transistor, a second transistor, a third transistor, a fourth transistor, a fifth transistor, and a first capacitor;

wherein a control electrode of the first transistor is connected to the first clock terminal, a first electrode of the first transistor is connected to the first input terminal, and a second electrode of the first transistor is connected to a second electrode of the second transistor;

wherein a control electrode of the second transistor is connected to the second clock terminal, a first electrode of the second transistor is connected to a second electrode of the third transistor, and a second electrode of the second transistor is connected to the second electrode of the first transistor;

wherein a control electrode of the third transistor is connected to a first electrode of the fourth transistor, a first electrode of the third transistor is connected to the first voltage terminal, and a second electrode of the third transistor is connected to the first electrode of the second transistor;

wherein a control electrode of the fourth transistor is connected to the first clock terminal, a first electrode of the fourth transistor is connected to the control electrode of the third transistor, and a second electrode of the fourth transistor is connected to the second voltage terminal;

wherein a control electrode of the fifth transistor is connected to the second electrode of the first transistor, a first electrode of the fifth transistor is connected to the control electrode of the third transistor, and a second electrode of the fifth transistor is connected to the first clock terminal;

wherein the first capacitor is connected between the first voltage terminal and the control electrode of the third transistor;

wherein a connection point of the second electrode of the first transistor and the second electrode of the second transistor forms a first control signal output terminal configured to output the first control signal; and wherein a connection point of the control electrode of the third transistor and the first electrode of the fourth transistor forms a second control signal output terminal configured to output the second control signal.

14. The gate driving circuit according to claim 11, wherein the first low level pulse generation module comprises a sixth transistor, a seventh transistor, and a second capacitor;

wherein a control electrode of the sixth transistor is configured to receive the first control signal, a first electrode of the sixth transistor is connected to a second electrode of the seventh transistor, and a second electrode of the sixth transistor is connected to the second clock terminal;

wherein a control electrode of the seventh transistor is configured to receive the second control signal, a first electrode of the seventh transistor is connected to the first voltage terminal, and a second electrode of the seventh transistor is connected to the first electrode of the sixth transistor;

wherein the second capacitor is connected between the first electrode of the sixth transistor and the control electrode of the sixth transistor; and wherein a connection point of the first electrode of the sixth transistor and the second electrode of the seventh transistor forms a first low level pulse output terminal configured to output the first low level pulse signal.

15. The gate driving circuit according to claim 11, wherein the second low level pulse generation module comprises an eighth transistor, a ninth transistor, and a third capacitor;

wherein a control electrode of the eighth transistor is configured to receive the first control signal, a first electrode of the eighth transistor is connected to a second electrode of the ninth transistor, and a second electrode of the eighth transistor is connected to the third clock terminal;

wherein a control electrode of the ninth transistor is configured to receive the second control signal, a first electrode of the ninth transistor is connected to the first voltage terminal, and the second electrode of the ninth transistor is connected to the first electrode of the eighth transistor;

wherein the third capacitor is connected between the first electrode of the eighth transistor and the control electrode of the eighth transistor; and wherein the connection point of the first electrode of the eighth transistor and the second electrode of the ninth transistor forms a second low level pulse output terminal configured to output the second low level pulse signal.

16. The gate driving circuit according to claim 11, wherein the high level pulse generation module comprises a tenth transistor, an eleventh transistor, a twelfth transistor, a thirteenth transistor, a fourteenth transistor, a fifteenth transistor, a fourth capacitor, and a fifth capacitor;

wherein a control electrode of the tenth transistor is connected to the first clock terminal, a first electrode of the tenth transistor is connected to the first voltage terminal, and a second electrode of the tenth transistor is connected to a first electrode of the eleventh transistor;

wherein a control electrode of the eleventh transistor is connected to the second input terminal, the first electrode of the eleventh transistor is connected to the second electrode of the tenth transistor, and a second electrode of the eleventh transistor is connected to a first electrode of the twelfth transistor;

wherein a control electrode of the twelfth transistor is configured to receive the first control signal, the first electrode of the twelfth transistor is connected to the second electrode of the eleventh transistor, and a second electrode of the twelfth transistor is connected to the second voltage terminal;

wherein the control electrode of the thirteenth transistor is connected to the first clock terminal, a first electrode of the thirteenth is connected to the second input terminal, and a second electrode of the thirteenth is connected to a control electrode of the fifteenth transistor;

wherein a control electrode of the fourteenth transistor is connected to the second electrode of the eleventh transistor, a first electrode of the fourteenth transistor is connected to the first clock terminal, and a second electrode of the fourteenth transistor is connected to a first electrode of the fifteenth transistor;

wherein a control electrode of the fifteenth transistor is connected to the second electrode of the thirteenth transistor, the first electrode of the fifteenth transistor is connected to the second electrode of the fourteenth transistor, and a second electrode of the fifteenth transistor is connected to the second voltage terminal;

wherein the fourth capacitor is connected between the first voltage terminal and the control electrode of the fourteenth transistor;

wherein the fifth capacitor is connected between the first electrode of the fifteenth transistor and the control electrode of the fifteenth transistor; and wherein the connection point of the second electrode of the fourteenth transistor and the first electrode of the fifteenth transistor forms a high level pulse output terminal configured to output the high level pulse signal.

* * * * *

UNITED STATES PATENT AND TRADEMARK OFFICE
CERTIFICATE OF CORRECTION

PATENT NO.       : 9,966,957 B2  
APPLICATION NO.  : 15/519966  
DATED            : May 8, 2018  
INVENTOR(S)      : Can Zheng et al.

Page 1 of 1

It is certified that error appears in the above-identified patent and that said Letters Patent is hereby corrected as shown below:

In Claim 6, Column 14, Line 65, delete "high level; a second" and insert therefor -- high level, a second --.

In Claim 10, Column 16, Line 46, delete "electrode of e h transistor" and insert therefor -- electrode of the tenth transistor --.

Signed and Sealed this  
Twenty-sixth Day of June, 2018

Andrei Iancu  
*Director of the United States Patent and Trademark Office*